United States Patent
Hausner

(10) Patent No.: US 8,652,343 B2
(45) Date of Patent: Feb. 18, 2014

(54) METHOD FOR SELECTIVELY REMOVING MATERIAL FROM THE SURFACE OF A SUBSTRATE, MASKING MATERIAL FOR A WAFER, AND WAFER WITH MASKING MATERIAL

(75) Inventor: Martin Hausner, Wiesbaden (DE)

(73) Assignee: Excelitas Technologies Singapore Pte. Ltd., Singapore (SG)

( * ) Notice: Subject to any disclaimer, the term of this patent is extended or adjusted under 35 U.S.C. 154(b) by 4 days.

(21) Appl. No.: 10/524,525

(22) PCT Filed: Aug. 14, 2003

(86) PCT No.: PCT/EP03/09052
§ 371 (c)(1),
(2), (4) Date: Aug. 18, 2005

(87) PCT Pub. No.: WO2004/017361
PCT Pub. Date: Feb. 26, 2004

(65) Prior Publication Data
US 2006/0027532 A1    Feb. 9, 2006

(30) Foreign Application Priority Data
Aug. 14, 2002    (DE) .................................. 102 37 249

(51) Int. Cl.
*B44C 1/22* (2006.01)
*H01L 21/302* (2006.01)
(52) U.S. Cl.
USPC ................... 216/68; 216/41; 216/51; 216/58; 216/67; 438/710; 438/717; 438/718

(58) Field of Classification Search
USPC ............ 216/41, 51, 58, 67, 68; 438/710, 717, 438/718
See application file for complete search history.

(56) References Cited

U.S. PATENT DOCUMENTS

| | | | | |
|---|---|---|---|---|
| 5,091,047 A | * | 2/1992 | Cleeves et al. ................. | 438/704 |
| 5,382,315 A | * | 1/1995 | Kumar ............................. | 216/39 |
| 5,599,743 A | * | 2/1997 | Nakagawa et al. ........... | 438/669 |
| 5,801,101 A | * | 9/1998 | Miyoshi ........................ | 438/714 |
| 6,068,000 A | * | 5/2000 | Tanabe et al. .................. | 134/1.3 |

(Continued)

FOREIGN PATENT DOCUMENTS

| | | | | |
|---|---|---|---|---|
| DE | 196 41 288 A1 | 4/1998 | ................ | C23F 4/00 |
| DE | 44 20 962 C2 | 9/1998 | ............ | H01L 21/308 |

(Continued)

OTHER PUBLICATIONS

Ayon et al., *Anisotropic silicon trenches 300-500 um deep employing time multiplexed deep etching (TMDE)*, Sensors and Actuators A, vol. 91, 2001, pp. 381-385.

(Continued)

*Primary Examiner* — Shamim Ahmed
(74) *Attorney, Agent, or Firm* — Peter A. Nieves; Sheehan Phinney Bass + Green PA

(57) ABSTRACT

A method for the selective removal of material from a substrate surface for forming a deepening includes the steps of applying a mask onto the substrate surface in accordance with the desired selective removal and dry-etching the substrate, a metal, preferably aluminum, being used as the masking material. Power may be coupled inductively to a plasma.

31 Claims, 3 Drawing Sheets

(56) References Cited

U.S. PATENT DOCUMENTS

| | | | |
|---|---|---|---|
| 6,074,946 A | 6/2000 | Ouellet et al. | 438/689 |
| 6,270,617 B1* | 8/2001 | Yin et al. | 156/345.48 |
| 6,270,687 B1* | 8/2001 | Ye et al. | 216/68 |
| 6,333,263 B1* | 12/2001 | Ngo et al. | 438/669 |
| 6,458,615 B1 | 10/2002 | Fedder et al. | 438/50 |
| 6,488,862 B1* | 12/2002 | Ye et al. | 216/67 |
| 6,531,031 B1* | 3/2003 | Becker et al. | 156/345.48 |
| 6,821,901 B2* | 11/2004 | Song et al. | 438/700 |
| 2001/0054383 A1* | 12/2001 | Pu et al. | 118/723 I |
| 2002/0006681 A1* | 1/2002 | Yamanaka et al. | 438/29 |
| 2002/0020494 A1 | 2/2002 | Yokogawa et al. | |
| 2002/0092618 A1* | 7/2002 | Collins | 156/345.48 |
| 2003/0087488 A1* | 5/2003 | Fink et al. | 438/200 |
| 2003/0162402 A1 | 8/2003 | Song et al. | |

FOREIGN PATENT DOCUMENTS

| | | | | |
|---|---|---|---|---|
| DE | 199 00 179 C1 | 2/2000 | | C23F 4/00 |
| DE | 199 27 806 A1 | 1/2001 | | H01L 21/3065 |
| DE | 197 36 370 C2 | 12/2001 | | H01L 21/3065 |
| JP | 63076437 A | 4/1988 | | H01L 21/302 |
| JP | 05021395 A | 1/1993 | | H01L 21/302 |
| JP | 05302182 A | 11/1993 | | C23F 4/00 |
| JP | 7-115209 A | 5/1995 | | |
| JP | 07130751 A | 5/1995 | | H01L 21/3213 |
| JP | 8-148468 A | 6/1996 | | |
| JP | 10-261713 A | 9/1998 | | |
| JP | 2000-124564 A | 4/2000 | | |
| JP | 2001-85388 A | 3/2001 | | |
| JP | 2001-345311 A | 12/2001 | | |
| KR | 20000006368 | 1/2000 | | |
| WO | WO 01/06539 A1 | 1/2001 | | H01J 37/32 |
| WO | WO 01/47005 A1 | 6/2001 | | H01L 21/308 |

OTHER PUBLICATIONS

Database WPI, *A method of through-etching substrate is provided to efficiently perform a cooling processing of a substrate and to improve a profile around a penetrated hole by using a metal material*, Section Ch, Week 200278, Derwent Publication Ltd., London, GB, AN2002-720751 (1 page).

Dijkstra et al., Can SEA (Semiconductor Equipment Assessment) also deliver for MEMS? Horological Journal, Ashford, GB, vol. 556, No. 302, 2001, pp. 684-690.

IBM Corp., *IBM Technical Disclosure Bulletin*, vol. 34, No. 5, Oct. 1991, pp. 368-370.

EPO, *International Search Report*, PCT/EP03/09052, May 18, 2004 (14 pages).

Kong et al., *Reactive Ion Etching of SiC Using C2F6/O2 Inductively Coupled Plasma*, Journal of Electronic Materials, vol. 31, No. 3, Mar. 2002, pp. 209-213.

A. J. Perry and R. W. Boswell, *Fast anisotropic etching of silicon in an inductively coupled plasma reactor*, Applied Physics Letters, American Institute of Physics, New York, vol. 55, No. 2, Jul. 10, 1989, pp. 148-150.

Rakhshandehroo et al., *Dry etching of Si field emitters and high aspect ratio resonators using an inductively coupled plasma source*, Journal of Vacuum Science and Technology: Part B, American Institute of Physics, New York, vol. 16, No. 5, Sep./Oct. 1998, pp. 2849-2854.

Tanaka et al., *Deep reactive ion etching of silicon carbide*, Journal of Vacuum Science and Technology B, vol. 19, No. 6, Nov./Dec. 2001, pp. 2173-2176.

Tian et al., *Comparison of Cl2 and F-based dry etching for high aspect ratio Si microstructures etched with an inductively coupled plasma source*, Journal of Vacuum Science & Technology B, vol. 18, No. 4, Jul./Aug. 2000, pp. 1890-1896.

Jason W. Weigold, *Design and Fabrication of Submicrometer, Single Crystal Si Accelerometer*, Journal of Microelectromechanical Systems, IEEE Inc., New York, vol. 10, No. 4, Dec. 2001, pp. 518-524.

Xiao et al., *Silicon micro-accelerometer with mg resolution, high linearity and large frequency bandwidth fabricated with two mask bulk process*, Sensors and Actuators A, vol. 77, 1999, pp. 113-119.

\* cited by examiner

METHOD FOR SELECTIVELY REMOVING MATERIAL FROM THE SURFACE OF A SUBSTRATE, MASKING MATERIAL FOR A WAFER, AND WAFER WITH MASKING MATERIAL

FIELD OF THE INVENTION

This invention relates to a removal method and a masking material for a substrate, e.g. a wafer and a substrate or a wafer with such a masking material according to the preambles of the independent claims.

BACKGROUND OF THE INVENTION

Material can be removed selectively from a substrate surface by masking the surface areas from which no material shall be removed and exposing the remaining, free areas to an etchant. Based on the non-masked areas, material can then be removed depthwise from the substrate. However, this may involve various problems:

- The etchant does not only etch the exposed surface areas but also the masking material. Depending on the duration of exposure, the masking can be thinned or fully be removed, followed by a removal of material from the substrate surface which should actually be protected.
- Underetching may result, i.e. etching occurs from the side walls of the already produced deepening laterally under the mask so that the edges under the masking layer have a fringed and non-defined appearance. Moreover, the walls of the resulting deepening are not smooth.
- Non-uniform etch rates within a single deepening and/or over several deepenings on a substrate result in undefined depths.
- Undesired redepositions of material removed by etching. Substrate and/or masking material removed by etching can deposit in an undesired way or at unfavorable sites on the substrate and/or the etching device and lead to unusable results or no longer operating etching devices.
- When deep deepenings (depth T>200 µm) are produced, the etch rate can be too low to yield economically efficient results.

Etch processes may be isotropic (i.e. have equal effects in all directions) or anisotropic (i.e. have effects better in some directions in space than in other directions in space). Wet etching is a usually isotropic etching process which is, however, relatively slow and cannot be used for etching deep deepenings, e.g. in a silicon wafer. Dry etching has a higher etch rate (removal per unit time). In this case, an etch plasma ($SF_6$, for example) is produced and placed on the sites to be etched for the purpose of exposure. In this connection, the term "plasma" is also understood to mean highly ionized (not fully ionized) states of matter. This is also referred to as RIE (reactive ion etching). In so far as deep deepenings have to be produced, this is referred to as DRIE (deep reactive ion etching) if dry etching is employed. Here, the special demands are made on the homogeneity of the etch process and the resistance of the masking material. Another increase in the etch rate can be achieved by means of ICP etching. In this method, highly ionized plasma is produced by inductive power coupling (ICP=inductively coupled plasma). The etch rates are so high that using conventional masking layers of polymers or oxides only poor deepening depths can be obtained before the masking layer is removed by etching along with the substrate.

On the other hand, it is known to use masking layers containing or being fully made (>98% by weight) of metallic materials, in particular aluminum. They have the property that even in the case of thin masking layers they have, also in the case of ICP etching, such a resistance that deep deepenings can be produced before the masking layer has been removed. Nevertheless material is also removed by etching from the masking layer. It accumulates inter alia in the etching device where it is found in or on the tubes supporting the inductive coupling. As a result, the tubes become metallically conductive so that the inductive coupling and thus the etch rate initially deteriorate and ultimately collapse. This leads to an expensive and time-consuming cleaning of the device.

The underetching of the masking layer is avoided by a method as known from U.S. Pat. No. 5,501,893. In short, this methods alternately (with a periodicity of some few seconds) supplies etch gas and a passivation gas to the surface to be etched. With a suitable layout, the passivating agent in the passivation gas deposits on the side walls of the deepening so that the etch gas only etches the bottom of the deepening thus avoiding underetching and producing approximately perpendicular walls.

It is the object of this invention to provide an etching method which permits the formation of deep deepenings at a high etch rate.

This object is achieved by the features of the independent claims. Dependent claims are directed to preferred embodiments of the invention.

SUMMARY OF THE INVENTION

The invention relates in particular to depth patterning in silicon or germanium or generally in a semiconductor or a material suitable as a semiconductor substrate. A dry-etching method is used for this purpose. The masking for the removal is also fully or partially effected with a metallic material, preferably aluminum or specific alloys. Finally, steps are taken to prevent the redeposition of the masking material (metal) also removed by etching, in particular on the etching device. It is preferred to couple inductive power (ICP) to the etching medium during the etching process. In this case, redeposition on the sensitive device components can be prevented by keeping the substrate at an adequate distance from the inductive coupling. This distance may be at least 8, preferably at least 10, more preferably at least 13 cm. The distance may also be at least 2 times, preferably at least 3 times, the mean free path length of the plasma atoms. The depth of the deepening to be produced is preferably at least 80 µm, more preferably at least 150 µm, most preferably at least 300 µm. It is also possible to fully penetrate through the wafer by etching (or etch up to an etch stop layer on the other side of the wafer).

BRIEF DESCRIPTION OF THE DRAWINGS

Individual embodiments of the invention are described below with reference to the drawings, in which.

DETAILED DESCRIPTION OF THE PREFERRED EMBODIMENT

Figure 1:
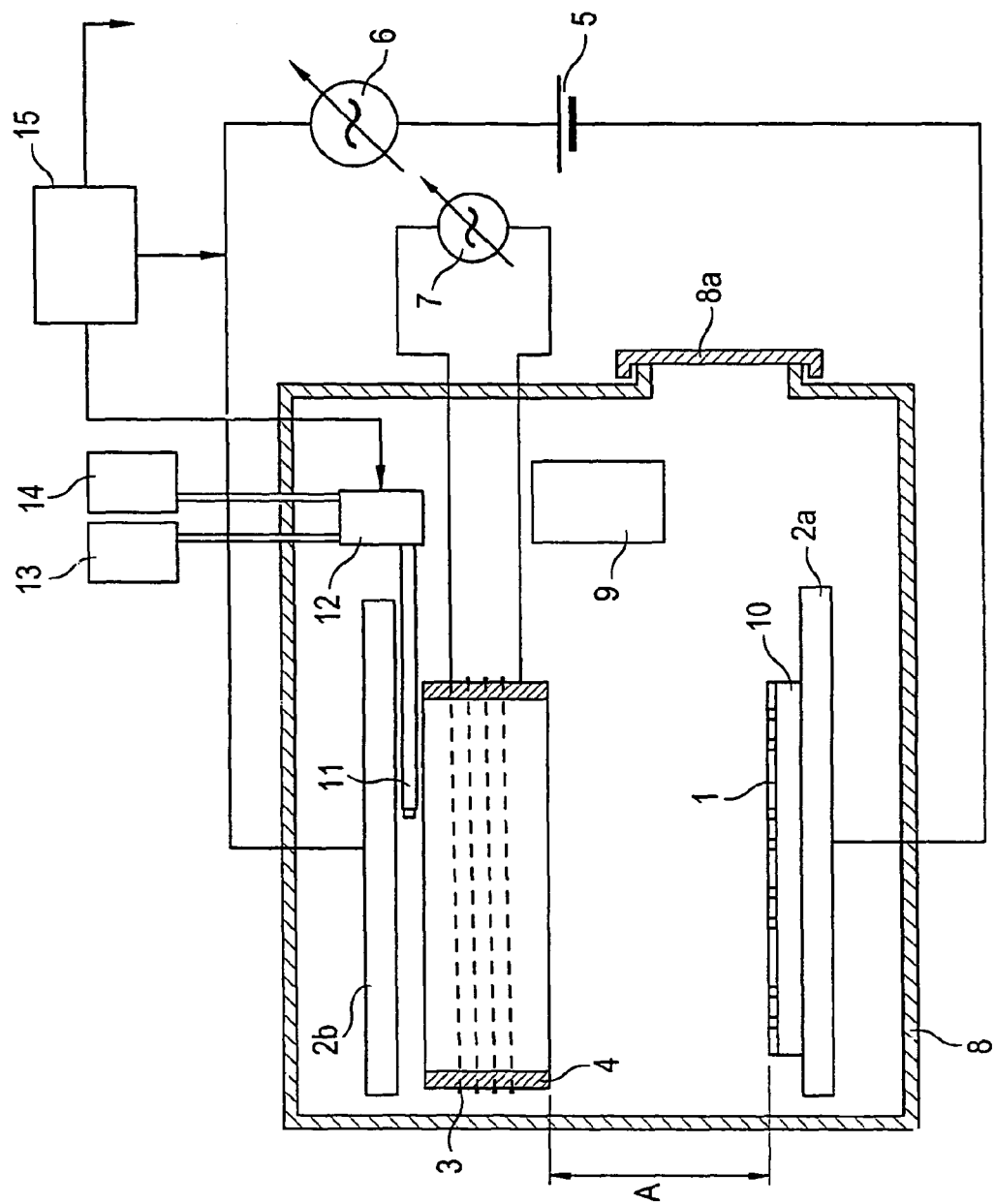
FIG. 1 shows a diagrammatic side view of the situation prevailing in the etching process.

FIG. 1 shows the situation prevailing in the etching process. 8 designates a vacuum container which is evacuated during the etching process. The pressure occurring during the etching step is preferably below 5 Pa, more preferably below 3 Pa. An opening 8a is provided to be able to insert a wafer 10 having a masking 1 thereon and remove it again. The wafer 10 with the masking 1 is placed on a table which is shown diagrammatically as a plate 2a of a capacitor whose opposite plate 2b is mounted in the top portion of chamber 8. During the etching step a direct voltage 5 of preferably 20-100 V and an alternating voltage 6 (frequency e.g. 13.56 MHz) are applied to the capacitor. 11 designates a gas inlet which introduces etch gas, on the one hand, and, where appropriate, also passivation gas, on the other hand, between plates 2a, 2b of the capacitor. For this purpose, a flow control 12 is provided which alternately supplies one gas or the other gas from corresponding storage tanks 13 and 14 to the outlet 11.

The inductive power coupling is effected by means of a coil 3 having some few turns (number of turns n<6, preferably <4). This coil is mounted on an e.g. tubular substrate 4 which may consist of a dielectric material, such as aluminum oxide, aluminum nitride, quartz, hard glass, quartz glass or mixtures of one or more of these materials, and is supplied with an alternating voltage having a frequency of also 13.56 MHz, for example, or generally ranging from 4 MHz to 41 MHz and a power of 2-5 KW. The etch rate is preferably greater than 1 μm/min, preferably greater than 2 μm/min.

The substrate 4 may be located directly on or under plate 2b of the capacitor. Several permanent magnets may be provided which may be arranged in series such that the north and south poles alternate. Several permanent magnets (not shown) may circumferentially be mounted at preferably regular intervals and also preferably outside the substrate 4. Poles of the magnetic field generated by the permanent magnets can be spaced in the axial direction of the substrate 4. The permanent magnets can be elongate and extend in the axial direction of the substrate 4 or in the direction of gas flow. In this case, the magnets can be distributed circumferentially in an alternately anti-parallel arrangement (N-S, then S-N, and N-S again, . . . ). The task of the permanent magnets is to render the induction effect for the ions and electrons more uniform and reduce the absolute value of the electron temperature on the wafer.

9 designates further components inside the vacuum container 8, e.g. automatic handling machines and the like. A control 15 controls the individual components. A pump for evacuating the container during the operation is not shown.

The masking 1 of wafer 10 includes a metallic material or an alloy, preferably containing aluminum, or consists fully thereof (>98% by weight). The distance A between the surface to be etched and the lower edge of the coil brace 4 or the coil 3 itself is at least 8 cm, preferably at least 10 cm, more preferably at least 12 cm or at least two times the mean free path length of the etch atoms, preferably at least three times the mean free path length thereof. This ensures that the aluminum also removed by etching does not redeposit on the internal wall of the coil brace 4. As a result, the latter does not become conductive and does not block the coupled magnetic field.

Alternatively to or together with aluminum, the masking may also contain Cr or Ni or Pt or Au or Fe as a major component (>90% by weight, preferably >96% by weight). Aluminum or nickel alloys may also be used, e.g. AlCu, AlSi, AlTi, NiFe, NiCr or also the chromium alloy CrAu. In particular the following alloys are conceivable as masking material:

AlNiFe, e.g. 11-13 Al, 21-23 Ni, balance Fe, "AlNi 090",
AlNiFe, e.g. 13-15 Al, 27-29 Ni, balance Fe, "AlNi 120",
AlNiCo, e.g. 9-11 Al, 19-21 Ni, 14-16 Co, >1 CuTi, balance preferably Fe, "AlNiCo 160",
AlNiCo, e.g. 11-13 Al, 18-20 Ni, 14-16 Co, 3-5 Cu, balance preferably Fe, "AlNiCo 190",
AlCu, e.g. 0.5-2 Cu, balance Al,
AlSi, e.g. 0.5-2 Si, balance Al,
AlTi, e.g. maximum of 3, preferably maximum of 1.5 Ti, balance Al,
NiFe, e.g. 35-37 Ni, balance Fe, "Hyperm 36 M",
NiFe, e.g. 49-51 Ni, balance Fe, "Hyperm 52",
NiCr, e.g. 78-82 Ni, balance Cr.
CrAu, e.g. 45-55 Cr, balance Au.

The above nondimensional values are indicated in % by weight or % by volume. The respective average values of the indicated ranges are particularly preferred.

Figure 2:
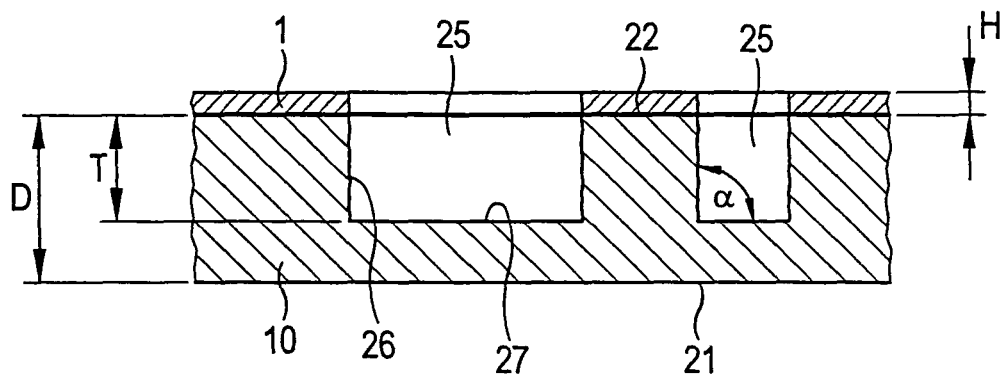
FIG. 2 shows the section of a partially etched wafer.

FIG. 2 shows a section of wafer 10 by way of diagram and enlarged. Wafer 10 is covered with masking 1. Masking 1 contains a metal or an alloy or a composite material containing a metal or consists fully thereof. A preferred material is aluminum or an aluminum alloy. The alloy may contain at least 90% by weight metal or aluminum. 25 designates already formed deepenings which have been etched into the wafer up to a certain depth. The current depth is here referred to as T. The thickness D of the wafer may be several hundred μm and range from 150 μm to 600 μm, for example. The height H of the masking layer 1 is less than 1 μm, preferably less than 500 nm. The walls may be made approximately perpendicularly. The angle α of a wall or of all walls with respect to the bottom may range from 85° to 95°. If desired, it may also be less than 90°. In this case, the deepening widens downwardly and partition walls becoming thinner downwardly are left between the deepenings. This may be advantageous, for example, whenever the material shall be perforated by etching and membranes for the thermally insulated support of sensors (in particular infrared detectors) have to be held by the ridges between the deepenings 25.

During ICP etching depthwise into the wafer, etch, and passivation gases may alternately be supplied. This can be effected by the flow control 12, optionally in accordance with the superior control 15. The gases are supplied from the reservoir 13 for etch gas and reservoir 14 for passivation gas. The individual phases may take some seconds each (in particular less than 10 s, preferably less than 6 s each) and directly take turns. The evacuation may be effected continuously.

Figure 3:
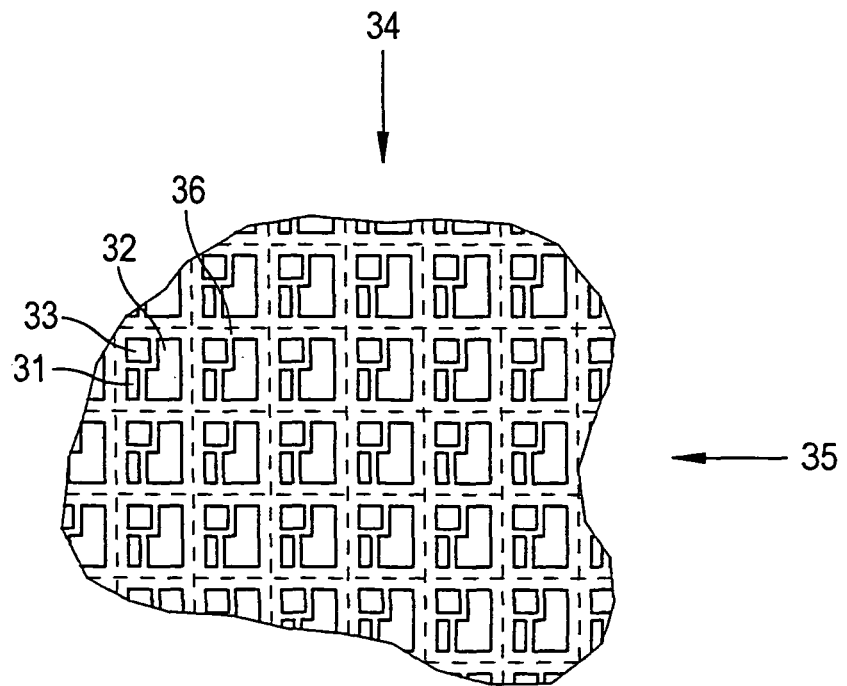
FIG. 3 shows a top view of a masked wafer (section)

FIG. 3 shows a top view onto a wafer section by way of diagram. A repeating pattern of deepenings is shown, the individual pieces of the pattern being arranged along lines 35 and columns 34. The dashed lines only serve the purpose of visualization and do not actually exist. Different deepenings 31, 32 and 33 are provided per individual pattern. They correspond to omissions in the mask 36 which covers the other wafer surface preferably fully and preferably also over the (vertical) circumference side of the wafer 10. In this way, many deepening patterns of the same kind can simultaneously be produced on a wafer in one production step, which after forming the deepenings are separated from one another. The area to be etched may be at least 8%, preferably at least 20%, of the substrate surface, most preferably more than 35%. The substrate per se may be a disk-like wafer which is substantially circular, for example, and has a diameter of at least 10 cm, preferably at least 15 cm. The wafer per se may contain silicon or fully consist thereof. It is preferably crystalline silicon.

Figure 4:
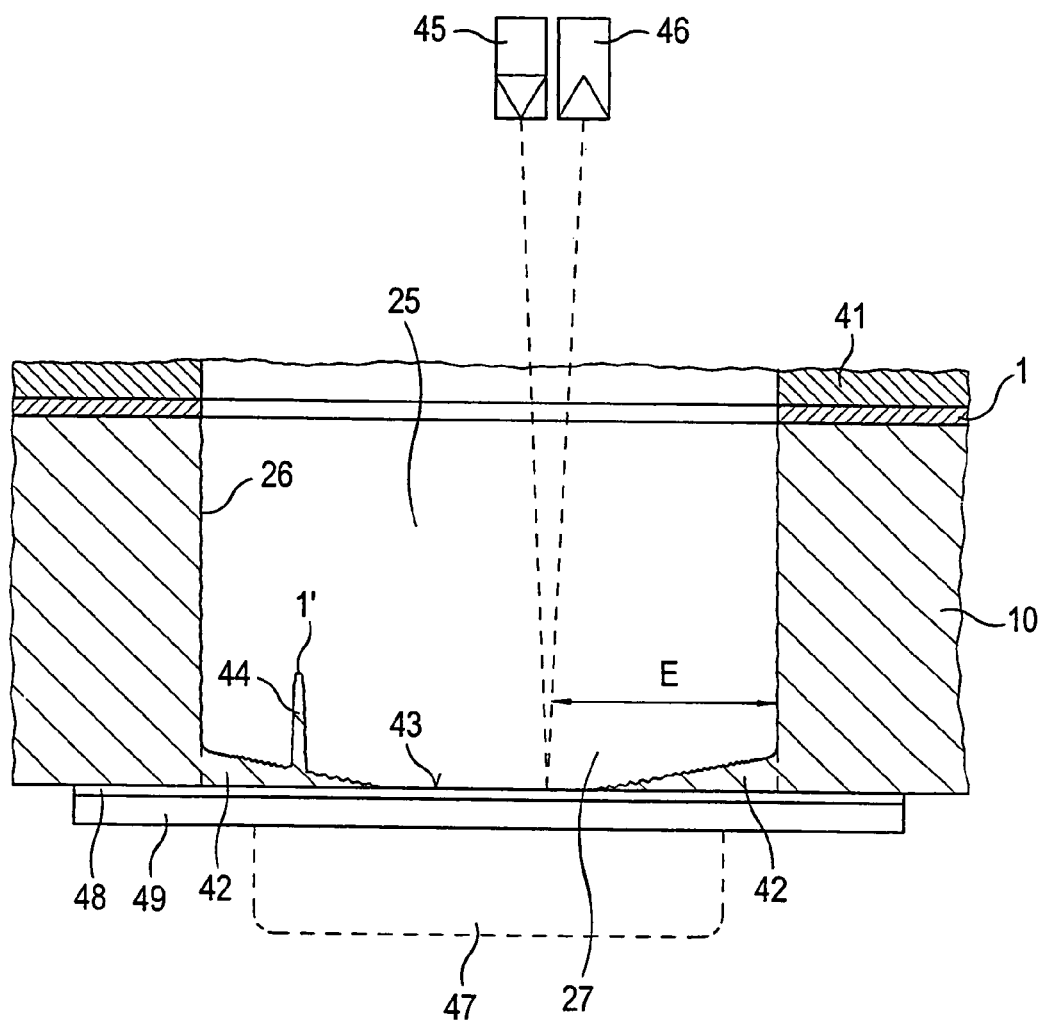
FIG. 4 shows the situation prevailing while the wafer is perforated by etching.

FIG. 4 shows a situation prevailing when a substrate or wafer 10 is perforated by etching. This figure shows the situation in which the wafer has already almost fully been penetrated through by etching from top to bottom. On the other substrate surface (bottom of FIG. 4), prior to the etching step this embodiment was provided in the area of the hole with an etch stop layer 48 to which a thin membrane 49 is applied on which an electronic component 47 which is to be kept thermally insulated can subsequently (or also simultaneously) be formed. The result of the above described etching step was that it was more likely that in the middle of the deepening 25 the material was already penetrated by etching up to the etch stop layer 48 which has a relatively smooth surface 43 and that the edges still contained areas 42 with substrate material, which have a comparatively rough surface. The formation of needles 44 can sometimes occur because of the redeposition of masking particles 1'.

A condition as shown in FIG. 4 can be detected by a depth sensor 45, 46. It may be e.g. a light source, in particular a laser light source 45 which preferably emits rays to the middle (distance E from the edge >20%, preferably >40% of the cross-sectional dimension Q (diameter or edge length) of the deepening 25. A sensor 46 analyses the reflected light. In the diagram, the optical path lengths are dashed. As long as laser light is reflected by the comparatively rough surface of the substrate still to be removed by etching (as shown diagrammatically at 42), the reflection is comparatively undirected and thus the reflected light received at the sensor 46 is poor. However, if the exposure of the etch stop layer 48 usually starts in the middle of the deepening 25, reflections from the then smoother surface 43 are more and more directed so as to increase the intensity received at sensor 46.

For example, the intensity of the received, reflected light can thus be interrogated with respect to a threshold value. It is also possible to interrogate the first derivative (change in the received signal) as to a threshold value. The first derivative can be formed in time-discrete manner. In general, the depth can be measured by analyzing the reflected light.

When the etch stop layer 48 is already partially exposed, another etching process may be used, preferably an isotropic etching process is employed to spare the etch stop layer 48, on the one hand, and remove by etching material in the edge portions 42 and needles 44. This can still be done by means of ICP. However, it is also possible to increase the gas pressure and/or reduce the applied bias. When the pressure is raised, the free path length is reduced and the direction of movement of the ions orients itself less strictly by the field lines of the applied direct voltage field, so that the etching process becomes more isotropic. A reduction of the applied direct voltage also results in a similar process or a more isotropic etching process.

After this second etching step, a third etching step can also be used ultimately, in which the applied bias is preferably zero. Apart from that it is possible to once more carry out etching in a dry state and/or with an inductively power-coupled plasma. This third etching step is preferably isotropic.

Having terminated the etching process, the mask 1 is removed. This can be done by wet etching which may be preceded by the removal of passivating agent residues (polymer residues) deposited on the mask. This can be done by means of oxygen plasma, for example. The mask itself can be removed by means of TMAH (tetramethylammonium hydroxide, preferably in aqueous solution—TMAHW).

The material from which material has to be removed is preferably a circular, crystalline wafer having a diameter of at least 10, preferably at least 15 cm.

The mask material preferably contains aluminum as its major component (amount >90% by weight, preferably >95% by weight). In addition, further elements can be added by alloying, e.g. copper (amount between 0.5 and 2% by weight, preferably below 1% by weight) and/or silicon (amount between 0.5 and 2% by weight) and/or titanium (amount below 3% by weight, preferably below 1.5% by weight). This masking material is considered an independent part of this invention. Wafers fully or partially covered with such a masking material are also considered an independent part of this invention.

The invention can generally be used for the deep patterning of substrates in micromechanics, e.g. to produce acceleration sensors with a movable mass or IR sensors which have to be kept in a thermally insulated condition.

Having described the invention, I claim:

1. A method for the selective removal of material from the surface of a silicon-containing substrate supported in a container for forming a deepening, comprising the steps of:
   applying a mask formed from aluminum onto the substrate surface in accordance with a desired selective removal of material from the surface of the substrate,
   dry-etching the substrate to selectively remove material from the surface of the substrate, and
   inductively coupling power into the etching medium during dry etching, the inductively coupled power provided by an inductive coupling coil in the form of a cylinder and having a lower edge, the coil disposed between a first capacitor plate within the container and a second capacitor plate within the container,
   wherein a cavity of a depth of at least 150 μm is generated at an etch rate of at least 2 μm/min,
   in turn with etching steps passivation steps are included, and
   keeping the substrate surface at a distance from the lower edge of the inductive coupling coil of at least two times the mean free path length of the plasma atoms, or at a distance of at least 8 cm from the lower edge of the inductive coupling coil.

2. The method according to claim 1, wherein the substrate is kept at a distance of at least 10 cm from the inductive coupling.

3. The method according to claim 1, wherein during etching the pressure is below 15 Pa.

4. The method according to claim 1, wherein material is removed up to the other side of the substrate.

5. The method according to claim 1, wherein a mask having a thickness of below 1.5 μm, is formed.

6. The method according to claim 1, wherein the substrate is masked up to the edge.

7. The method according to claim 1, wherein when the mask is applied aluminum is vapor-deposited or sputtered.

8. The method according to claim 1, wherein when the mask is applied a metallic layer is etched in accordance with the desired selective removal.

9. The method according to claim 1, wherein the metal used contains at least 90% by weight Al.

10. The method according to claim 1, wherein the etch position is determined repeatedly in a depthwise direction, etching being concluded or a second etching process, which is qualitatively different or proceeds with operating parameters differing from those of the preceding etching process, being employed when a certain position has been reached.

11. The method according to claim 10, wherein a depth is determined by means of a laser light whose properties are analyzed after being reflected by a bottom, in particular with respect to a first derivative of a detected signal.

12. The method according to claim 10, wherein in the second etching process etching is carried out in a dry condition with inductively power-coupled plasma, a gas pressure being higher and/or an applied bias being lower.

13. The method according to claim 11, wherein in the second etching process etching is carried out in a dry condition with inductively power-coupled plasma, a gas pressure being higher and/or an applied bias being lower.

14. The method according to claim 10, wherein after the second etching process a third etching process is applied which is qualitatively different from the preceding etching process or proceeds with operating parameters differing from those of the preceding etching process.

15. The method according to claim 11, wherein after the second etching process a third etching process is applied which is qualitatively different from the preceding etching process or proceeds with operating parameters differing from those of the preceding etching process.

16. The method according to claim 12, wherein after the second etching process a third etching process is applied which is qualitatively different from the preceding etching process or proceeds with operating parameters differing from those of the preceding etching process.

17. The method according to claim 14, wherein in the third etching process etching is carried out in a dry and isotropic condition and preferably with inductively power-coupled plasma, wherein the applied bias may be 0.

18. The method according to claim 1, wherein before the mask is removed an incineration step for polymer residues on the mask is preferably provided by wet etching.

19. The method according to claim 18, wherein the incineration is effected by means of oxygen plasma.

20. The method according to claim 18, wherein the incineration is followed by a treatment with tetramethylammonium hydroxide.

21. The method according to claim 19, including the incineration is followed by a treatment with tetramethylammonium hydroxide.

22. The method according to claim 1, including one or more of the following features:
the material is removed from more than 8% of the substrate surface,
the substrate is a disk-like wafer having a diameter of at least 10 cm.

23. A method for the selective removal of material from the surface of a silicon-containing substrate supported in a container for forming a deepening, comprising the steps of:
applying a mask onto the substrate surface in accordance with a desired selective removal of material from the surface of the substrate, aluminum being used for forming the mask,
dry-etching the substrate to selectively remove material from the surface of the substrate, and
inductively coupling power into the etching medium during dry etching, the inductively coupled power provided by an inductive coupling coil in the form of a cylinder and having a lower edge, the coil disposed between a first capacitor plate within the container and a second capacitor plate within the container,
wherein a cavity which fully penetrates through the substrate is generated at an etch rate of 2 µm/min,
in turn with etching steps passivation steps are included, and
keeping the substrate surface at a distance from the lower edge of the inductive coupling coil of at least two times, the mean free path length of the plasma atoms, or at a distance of at least 8 cm from the lower edge of the inductive coupling coil, an electric field is applied between the substrate and the inductive coupling coil.

24. A method for the selective removal of material from the surface of a silicon-containing substrate supported in a container for forming a deepening, comprising the steps of:
applying a mask onto the substrate surface in accordance with a desired selective removal of material from the surface of the substrate, aluminum or an aluminum alloy having at least 90% by weight Al or of a composite material having at least 90% by weight Al being used for forming the mask,
dry-etching the substrate to selectively remove material from the surface of the substrate, and
inductively coupling power into the etching medium during dry etching using an inductively power-coupled plasma, the inductively coupled power provided by an inductive coupling coil in the form of a cylinder and having a lower edge, the coil disposed between a first capacitor plate within the container and a second capacitor plate within the container,
wherein a cavity of a depth of at least 300 µm is generated at an etch rate of at least 2 µm/min,
in turn with etching steps passivation steps are included, and
keeping the substrate surface at a distance front the lower edge of the inductive coupling coil of at least two times the mean free path length of the plasma atoms, or at a distance of at least 8 cm from the lower edge of the inductive coupling coil.

25. The method according to claim 1, wherein the substrate surface is kept at a distance from the lower edge of the inductive coupling coil of at least three times the mean free path length of the plasma atoms, or at a distance of at least 8 cm from the lower edge of the inductive coupling coil.

26. The method according to claim 3, wherein during etching the pressure is below 10 Pa and/or above 1 Pa.

27. The method according to claim 5, wherein a mask having a thickness below 0.6 µm is formed.

28. The method according to claim 22, wherein the material is removed from more than 20% of the substrate surface.

29. The method according to claim 22, wherein the substrate has a diameter of at least 15 cm.

30. The method according to claim 23, wherein the substrate surface is kept at a distance from the lower edge of the inductive coupling coil of at least three times the mean free path length of the plasma atoms, or at a distance of at least 8 cm from the lower edge of the inductive coupling coil.

31. The method according to claim 24, wherein the substrate surface is kept at a distance from the lower edge of the inductive coupling coil of at least three times the mean free path length of the plasma atoms, or at a distance of at least 8 cm from the lower edge of the inductive coupling coil.

* * * * *